(12) United States Patent
Feiweier et al.

(10) Patent No.: US 7,218,113 B2
(45) Date of Patent: May 15, 2007

(54) MAGNETIC RESONANCE SYSTEM AND OPERATING METHOD FOR RF PULSE OPTIMIZATION

(75) Inventors: Thorsten Feiweier, Poxdorf (DE); Ralf Ladebeck, Erlangen (DE); Ralph Oppelt, Uttenreuth (DE); Wolfgang Renz, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 16 days.

(21) Appl. No.: 11/036,727

(22) Filed: Jan. 14, 2005

(65) Prior Publication Data

US 2005/0189940 A1 Sep. 1, 2005

(30) Foreign Application Priority Data

Jan. 14, 2004 (DE) ...................... 10 2004 002 009

(51) Int. Cl.
*G01V 3/00* (2006.01)

(52) U.S. Cl. ....................................... 324/320; 324/318

(58) Field of Classification Search .................... None
See application file for complete search history.

(56) References Cited

U.S. PATENT DOCUMENTS

| 4,685,468 | A | * | 8/1987 | Macovski | 600/410 |
|---|---|---|---|---|---|
| 6,411,090 | B1 | * | 6/2002 | Boskamp | 324/318 |
| 6,509,735 | B2 | * | 1/2003 | Mueller et al. | 324/307 |
| 6,777,934 | B2 | * | 8/2004 | Takahashi et al. | 324/309 |
| 6,937,015 | B2 | * | 8/2005 | Heid | 324/307 |
| 6,989,673 | B2 | * | 1/2006 | Zhu | 324/318 |
| 7,038,453 | B2 | * | 5/2006 | Feiweier et al. | 324/314 |
| 2003/0184293 | A1 | | 10/2003 | Boskamp et al. | 324/318 |
| 2004/0155656 | A1 | | 8/2004 | Leussler | 324/318 |
| 2005/0073304 | A1 | * | 4/2005 | Feiweier et al. | 324/307 |
| 2005/0110487 | A1 | * | 5/2005 | Zhu | 324/309 |
| 2005/0189940 | A1 | * | 9/2005 | Feiweier et al. | 324/307 |
| 2006/0054810 | A1 | * | 3/2006 | Grasslin et al. | 250/299 |
| 2006/0197526 | A1 | * | 9/2006 | Weiger et al. | 324/309 |
| 2006/0244450 | A1 | * | 11/2006 | Kruiskamp et al. | 324/320 |

\* cited by examiner

*Primary Examiner*—Diego Gutierrez
*Assistant Examiner*—Tiffany A. Fetzner
(74) *Attorney, Agent, or Firm*—Schiff Hardin LLP

(57) ABSTRACT

In a magnetic resonance system and an operating method therefor, a $B_1$ field distribution of a radio-frequency antenna is measured in at least one part of a examination volume of the magnetic resonance system, and then the RF pulses emitted by the radio-frequency antenna are optimized, based on the determined $B_1$ field distribution, for homogenization in a specific volume. An effective volume within the examination volume is determined beforehand for each applied RF pulse and, based on the determined $B_1$ field distribution, the appertaining RF pulse is individually adjusted such that the $B_1$ field is homogenized within the effective volume of the RF pulse.

13 Claims, 4 Drawing Sheets

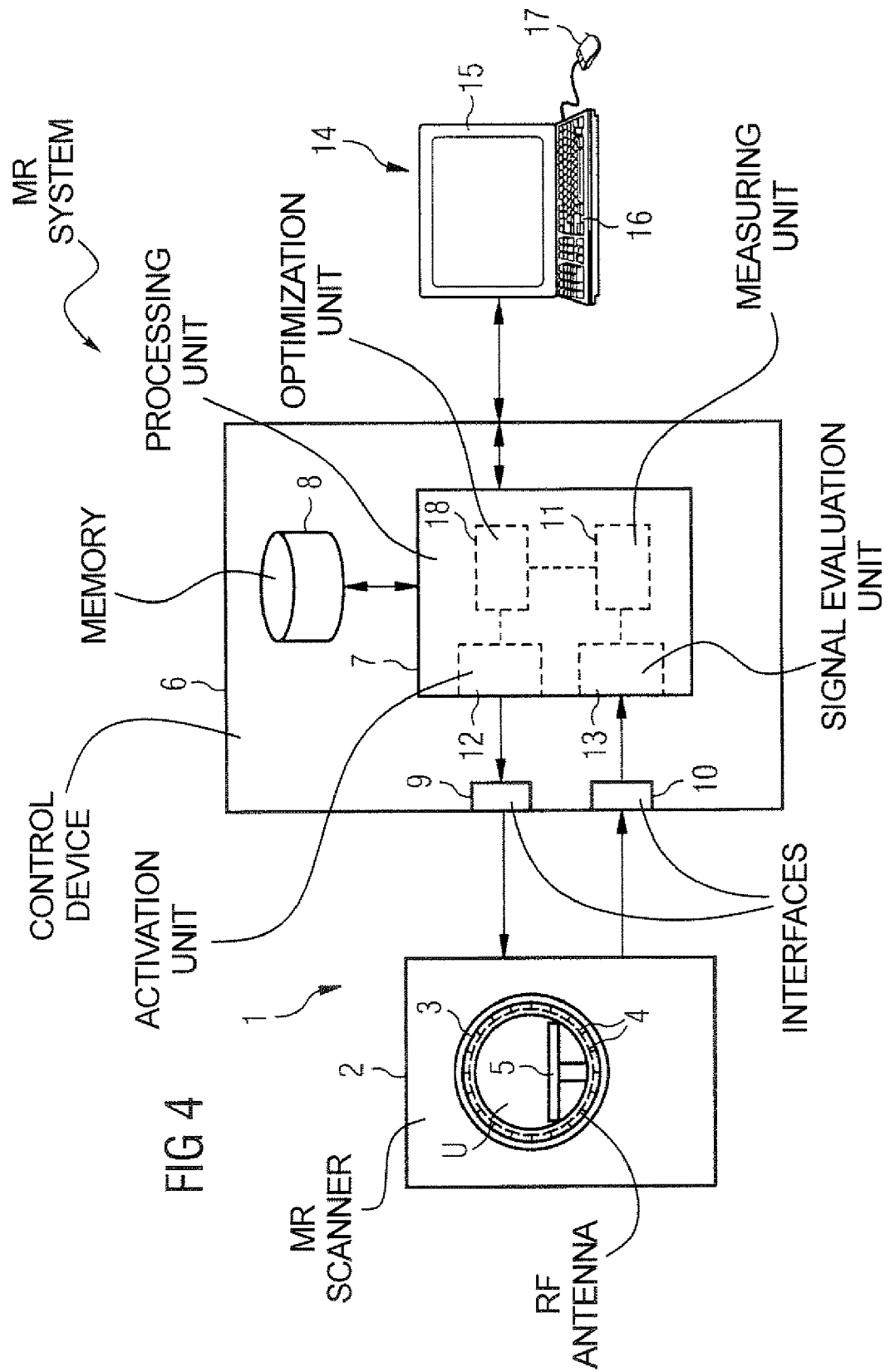

MAGNETIC RESONANCE SYSTEM AND OPERATING METHOD FOR RF PULSE OPTIMIZATION

BACKGROUND OF THE INVENTION

1. Field of the Invention

The invention concerns a method for operation of a magnetic resonance system of the type wherein, in which a $B_1$ field distribution of the radio-frequency pulses ("RF pulses") radiated into an examination volume by a radio-frequency antenna of the magnetic resonance examination system is determined, and then the RF pulses emitted by the radio-frequency antenna are optimized, based on the determined $B_1$ field distribution, for homogenization in a specific volume. Moreover, the invention concerns a magnetic resonance system of the type having a radio-frequency antenna for emission of RF pulses into an examination volume, with a measuring unit to measure a $B_1$ field distribution of the RF pulses radiated into the examination volume by the radio-frequency antenna, and with a control device which, based on the determined $B_1$ field distribution, optimizes the RF pulses emitted by the radio-frequency antenna for homogenization in a specific volume.

2. Description of the Prior Art

Magnetic resonance tomography (MR tomography) has become a widespread technique for acquisition of images of the inside of the body of a living examination subject. In order to acquire an image with this modality, the body or body part of the patient is initially exposed to an optimally homogenous static basic magnetic field (generally designated as a $B_0$ field) that is generated by a basic field magnet of the magnetic resonance measurement device. During the acquisition of the magnetic resonance images, rapidly switched gradient fields that are generated by gradient coils are superimposed on this basic magnetic field for spatial coding. Moreover, with a radio-frequency antenna, RF pulses of a defined field strength are radiated into the examination volume in which the examination subject is located. The pulse-shaped radio-frequency field that is generated thereby is generally called a $B_1$ field. By means of these RF pulses, the nuclear spins of the atoms in the examination subject are excited such that they are moved from their state of equilibrium, which runs parallel to the basic magnetic field $B_0$, by what is known as an "excitation flip angle" (or "flip angle"). The nuclear spin then processes in the direction of the basic magnetic field $B_0$. The magnetic resonance signals thereby generated are acquired by radio-frequency receiving antennas. The receiving antennas can be either the same antennas with which the RF pulses were radiated or separate receiving antennas. The magnetic resonance images of the examination subject are ultimately generated based on the received magnetic resonance signals. Every image point in the magnetic resonance image is associated with a small body volume, what is known as a "voxel", and every brightness or intensity value of the image points is linked with the signal amplitude of the magnetic resonance signal received from this voxel. The association between a resonant radiated RF pulse with the field strength $B_1$ and the flip angle $\alpha$ achieved therewith is given by the equation $$\alpha = \int_{t=0}^{\tau} \gamma \cdot B_1(t) \cdot dt \quad (1)$$

wherein $\gamma$ is the gyromagnetic ratio (which can be viewed as a fixed material constant for most of the nuclear magnetic resonance examinations) and $\tau$ is the effective duration of the RF pulse. The flip angle achieved by an emitted RF pulse, and thus the strength of the magnetic resonance signal, consequently depends on (aside from the duration of the RF pulse) the strength of the radiated $B_1$ field. Spatial fluctuations in the field strength of the excited $B_1$ field therefore lead to unwanted variations in the received magnetic resonance signal that can adulterate the measurement result.

For high magnetic field strengths—that are inevitable given due necessary magnetic basic field $B_0$ in a magnetic resonance tomography scanner—the RF pulses disadvantageously exhibit an inhomogeneous penetration behavior in conductive and dielectric media such as, for example, tissue. This leads to the $B_1$ field significantly varying within the measurement volume.

In particular in examinations known as ultra-intense field magnetic resonance examinations, in which modern magnetic resonance systems are used with a basic magnetic field of three Tesla or more, special measures must be taken in order to achieve an optimally homogenous distribution of the transmitted RF field of the radio-frequency antenna in the entire volume.

In United States Application Publication 2003/0184293, the function and an application of a multi-channel transmission array is specified for this purpose. The radio-frequency signal emitted by a radio-frequency transmission amplifier is apportioned via an output splitter and a phase shifter among the individual segments of the array. In this document, however, it is only very generally mentioned that a field homogenization can be achieved with this technique.

A further promising approach for this purpose is specified in German OS 101 24 465, corresponding to United States Application Publication 2004/0155656. In this document, a transmission and reception coil for MR apparatuses is specified that has a number of individual antenna elements (resonator segments) that are arranged around the examination volume within a gradient tube. These antenna elements are interconnected into a large-area volume antenna similar to what is known as a birdcage antenna. The individual antenna elements are electromagnetically decoupled from one another via interconnected capacitors. A separate transmission channel via which the radio frequency feed ensues is associated with each antenna element. Phase and amplitude thereby can be individually predetermined for each antenna element. In principle, this enables a complete control of the radio-frequency field distribution in the examination volume (known as "RF shimming"). It is proposed to improve the homogeneity of the RF field in the entire examination volume in this manner. Since, however, in a magnetic scan, every RF pulse acts in general in a different manner both with regard to its function and with regard to the relevant volumes, this optimization strategy is too restrictive.

SUMMARY OF THE INVENTION

An object of the present invention to provide a method for operation of a magnetic resonance system and a magnetic resonance system, with which a better optimization of the RF pulses with regard to the homogeneity of the $B_1$ field can be achieved.

This object is achieved by a method according to the invention wherein, for each applied RF pulse, an effective volume within the examination volume is determined beforehand and individually adjusted, based on the determined field distribution of the appertaining RF pulse, such that the $B_1$ field is homogenized within the effective volume of the RF pulse. The best possible functionality of each applied RF pulse is thereby achieved. The consequence of this is an image quality optimized with regard to all radio-frequency-sensitive dependencies.

For this purpose, the inventive magnetic resonance system must have a control device and a radio-frequency antenna that are fashioned such that, for each applied RF pulse, an effective volume within the examination volume can be determined beforehand and individually adjusted, based on the determined field distribution of the appertaining RF pulse, such that the $B_1$ field is homogenized within the effective volume of the RF pulse.

In order to individually optimize the "RF shim" for each individually applied RF pulse, such that an optimal homogenization is achieved in the effective volume of the RF pulse, it is absolutely necessary to know the $B_1$ distribution within the appertaining effective volume. This means that the $B_1$ field distribution must be measured in the examination volume with spatial resolution.

One possibility for implementation of such a measurement is known as a "double echo radio-frequency pulse sequence", in which a first excitation pulse and two refocusing pulses for generation of a first echo and a second echo, is emitted via the radio-frequency antenna. This means that initially a first radio-frequency excitation pulse is emitted, which tips the nuclear spins by, for example, a flip angle $\alpha_1$. After a specific time, a second pulse (known as a "refocusing pulse") is emitted that leads to a further tipping by $2\cdot\alpha_1$. After measurement of a first echo (known as the spin echo), a further $\alpha_1$ refocusing pulse is then emitted and a second echo (known as the stimulated echo) is measured. For the amplitudes of the measured spin echo signal $A_{SE}$ and of the measured stimulated echo signal $A_{STE}$, the following dependencies on the flip angle $\alpha_1$ apply:

$$A_{SE}=e^{i\phi}\sin^3(\alpha_1) \qquad (2a)$$

$$A_{STE}=e^{i\phi}\sin^3(\alpha_1)\cos(\alpha_1) \qquad (2b)$$

wherein $\phi$ designates the phase position of the echo signal. The flip angle $\alpha_1$ achieved with such a pulse sequence consequently can be determined from the ratio of the amplitudes of both echo signals by the relation $$\cos\alpha_1 = \frac{A_{STE}}{A_{SE}} \qquad (3)$$

This flip angle $\alpha_1$ can be converted into the radiated $B_1$ field using equation (1).

In order to be able to measure with spatial resolution, in this method at least the excitation pulse is slice-selectively radiated. Preferably only the excitation pulse but not the refocusing pulses is slice-selectively radiated. In the excitation slice established by means of the excitation pulse data for, a first echo image and a second echo image are then measured with spatial resolution via the radiation of the appropriate gradient pulses. Such a "spatially resolved" measurement of the echo images is possible with a method in which initially both echoes are measured by the application of a readout gradient by sampling the time curve with m data points multiple times with n different amplitudes of the phase coding gradient. The result of this measurement is then a data matrix with m columns and n rows for each of the echoes (i.e. the spin echo and the stimulated echo) in the time domain (also called "k-space").

This matrix is two-dimensionally Fourier-transformed for each echo. For each echo a real two-dimensional image with k–l·pixels is thereby obtained, in general with m=n=k–l being set. Using the ratio of the amplitudes of the first and second echo image at the various locations, i.e. for each individual image pixel, the local flip angles are then measured at the appertaining locations. By such a measurement, the flip angle, i.e. a flip angle distribution, can be measured with spatial resolution within the slice. The flip angle measured at a specific location is in turn representative for the $B_1$ field radiated at the appertaining location, with the dependency given by equation (1). This means that, using this equation (given knowledge of the pulse used), it can be arbitrarily converted from a flip angle distribution into a $B_1$ field distribution and vice versa. Thus herein a determination of a flip angle distribution is equated with a determination of the corresponding $B_1$ field distribution.

As an alternative to this technique, any other suitable method for spatially-resolved measurement of the $B_1$ field distribution can be used.

In principle, it is possible for a user to individually predetermine the effective volume for every pulse, for example via suitable functions of a user interface of the magnetic resonance system.

However, for an RF pulse to be radiated, the effective volume preferably is automatically determined on the basis of the control parameters for radiation of the appertaining RF pulse. This means that the effective volume is automatically determined for the individual types of pulses in an "intelligent measurement sequence".

The system thereby recognizes, for example, whether slice-selective excitation and refocusing pulses are being used. This means that the slice in which the RF pulse acts in the examination volume is, for example, determined using the control parameters—for example, using the slice gradient to be set and the frequency of the RF pulse to be radiated. The measurement parameters coming directly from the user interface or from a planning program, which measurement parameters contain immediate information about the slice position and type of the acquisition, preferably can be used. The effective volume is then particularly suitably selected, substantially corresponding to the selected slice, for a slice-selective RF pulse to be radiated. The term "slice" as used herein encompasses a thicker slice of the type used for a 3D volume acquisition, known as a "slab".

The system can likewise automatically recognize whether a preparation pulse (for example a saturation pulse or magnetization transfer pulse) without spatial selectivity or with spatial selectivity (with or without spectral selectivity) is employed and, if so, in which region the preparation pulse should act.

For a preparation pulse to be radiated without spatial selectivity, the effective volume is determined based on the set union of a specific number of slices, preferably based on the set union of all slices or slab volumes acquired in the examination.

Fat saturation pulses lend themselves best to this, since fat saturation pulses generally are applied without spatial selectivity.

For a preparation pulse acting only regionally, the effective volume preferably is selected such that it substantially corresponds to the appertaining region.

In a preferred embodiment of the method, the user can additionally predetermine a region of interest to the user, for example the user can already set what is known as the "region of interest" in the planning. A optimization value is then respectively, automatically determined within the appertaining effective volume dependent on this region of interest. For example, the optimization volume can be established as a slice quantity from the (preferably automatically) determined effective volume and the region of interest predetermined by the user. The RF pulse is then individually adjusted such that the $B_1$ field is optimally homogenous within the optimization volume.

For this purpose, the magnetic resonance system must have a corresponding user interface for input of a region of interest within the examination volume, and the control unit must be fashioned in order to determine the optimization volume based on the region of interest within the effective volume, and then to individually adjust the RF pulses such that the $B_1$ field is homogenized within the optimization volume.

In order to achieve a corresponding homogenization of the RF pulses in the desired effective volume or optimization volume, the magnetic resonance system preferably has a radio-frequency antenna formed as an antenna arrangement with a number of antenna elements. Moreover, this magnetic resonance system has an activation unit in order to respectively activate the antenna elements with a specific phase and a specific amplitude for each RF pulse. One possibility for the design of such an antenna arrangement is described in German OS 101 24 465 (cited above), the teachings of which are incorporated herein by reference.

Given the use of a radio-frequency antenna composed of multiple antenna elements, the $B_1$ field distribution preferably is separately determined for each antenna element in order to determine the effect of that individual antenna element within the examination volume. This means that, for example, the "double-echo radio-frequency pulse sequence" cited above for spatially-resolved measurement of the $B_1$ field is radiated by each individual antenna element in succession.

Since the automatic calculation of the effective volume, and in particular also the calculation of the optimized control parameters for activation of the radio-frequency antenna, is relatively calculation-intensive and thus time-consuming, a complete calculation of the acquisition sequence preferably ensues beforehand for all optimized RF pulses to be radiated during the diagnostic data acquisition sequence. This means that all effective volumes and/or optimization volumes are determined in a planning cycle for the individual RF pulses, and the optimized control parameters, for example the individual phases and amplitudes for the various antenna elements, are calculated and stored in a measurement protocol. In the actual measurement, only the activation of the radio-frequency antenna then ensues according to the pre-calculated measurement protocol, with the matching amplitude and phase activation of the individual antenna elements being adjusted immediately prior to radiation of the RF pulse.

The realization of the control device of the inventive magnetic resonance system preferably ensues using software components. Typical control devices of existing magnetic resonance systems normally include a programmable processor anyway, such that an upgrade of these magnetic resonance systems is possible in a simple manner with a corresponding software update. It is then only necessary for the magnetic resonance system have a suitable radio-frequency antenna, for example with a number of separately activatable antenna elements, in order to be able to arbitrarily influence the radiated $B_1$ field of the individual RF pulses.

DESCRIPTION OF THE DRAWINGS

FIG. 2b is the second part of the flow chart of FIG. 2a.

FIG. 4 is a schematic illustration of an inventive magnetic resonance system.

DESCRIPTION OF THE PREFERRED EMBODIMENTS

Figure 1:
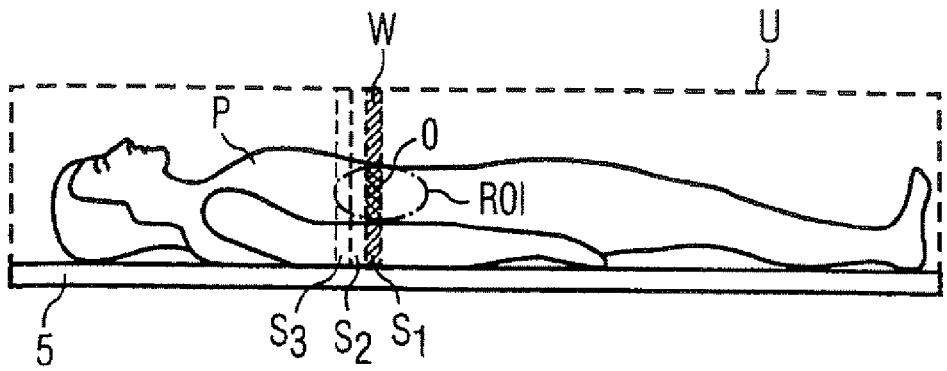
FIG. 1 schematically illustrates the establishment of an effective volume within a larger examination volume in an MR scan.

A patient P lying on a patient bed 5 within an examination volume U of the magnetic resonance system is shown in FIG. 1. In the MR examination, exposures (scans) are generated in various slices S, $S_1$, $S_2$, $S_3$ perpendicular to the longitudinal axis of the patient P. For clarity, here only three slices $S_1$, $S_2$, $S_3$ are shown, significantly enlarged. The optimization of the radiated RF pulses inventively ensues, for each individual RF pulse, with regard to the slice in which the appertaining RF pulse should act. As an example, in FIG. 1 the slice $S_1$ is determined as an effective volume W, with regard to which an optimal homogenization of the RF pulse radiated for excitation of the appertaining slice $S_1$ should ensue.

Additionally, in FIG. 1 the possibility of an operator of the MR system determining a "region of interest" ROI is schematically shown. In this case, the optimization of the RF pulse optionally ensues predominantly with regard to the slice quantity made up of effective volume W and region of interest ROI, i.e. in a limited sub-region of the effective volume W, the "optimization volume" O.

Figure 2A:
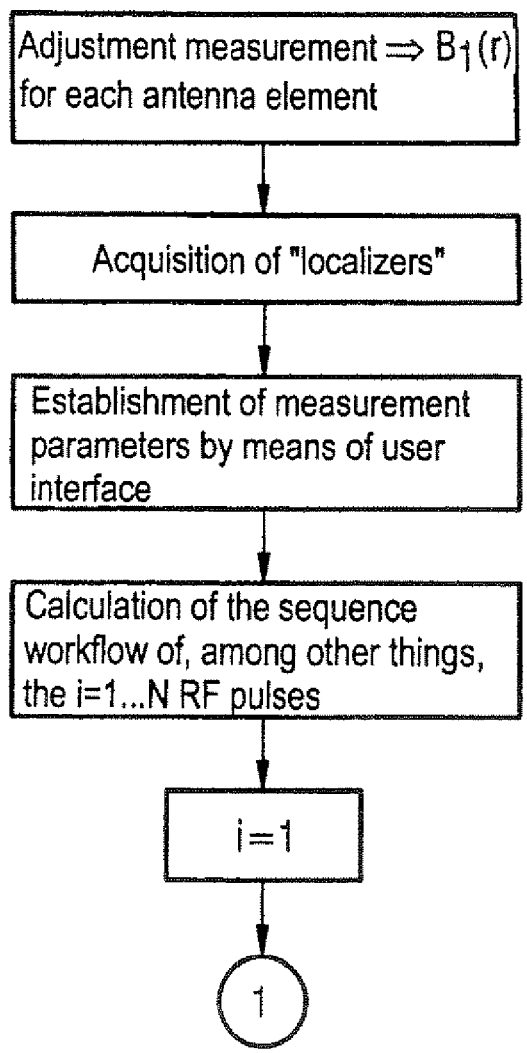
FIG. 2a is the first part of a flow chart of an embodiment for automatic establishment of the effective volumes and the calculation of the optimized activation parameters for the radiation of optimized RF pulses in accordance with the invention.
Figure 2B:
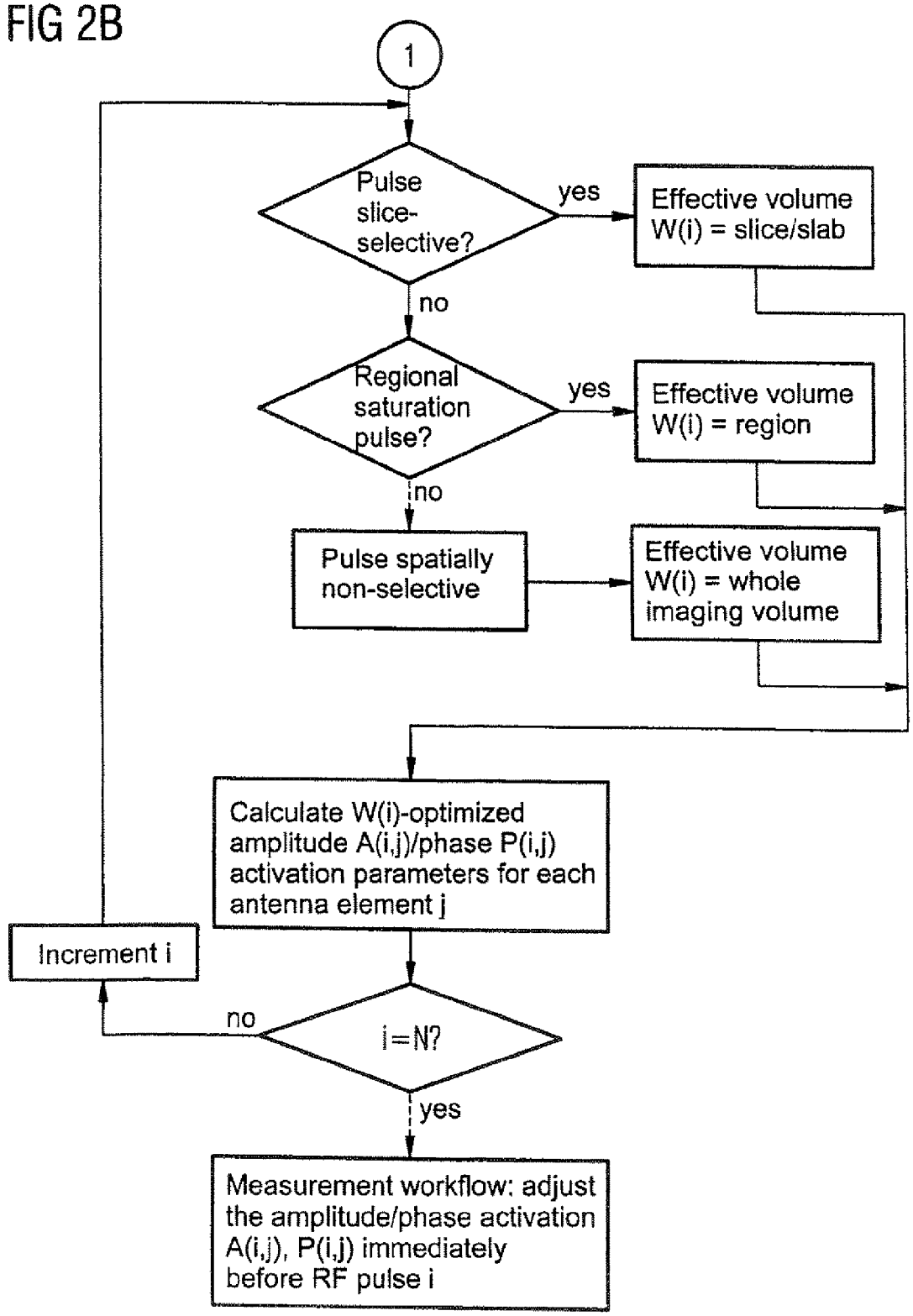

A possible measurement workflow is shown in the flow chart in FIGS. 2a and 2b. Shown here is a method in which the effective volume is fully-automatically established—for example by the control device of the magnetic resonance system—dependent on the exposures to be produced.

Such a measurement workflow begins with an adjustment measurement in which the $B_1$ field distribution in the examination volume U of a radio-frequency antenna 3 is measured. In the present case, the radio-frequency antenna 3 has a number of individual antenna elements 4. In the adjustment measurement, the $B_1$ field therefore is respectively, separately measured for all antenna elements 4 in order to determine the effect of the individual antenna elements 4 within the examination volume.

This adjustment measurement ensues immediately prior to the actual measurement, whereby the patient is already located within the examination volume and the influences given by the special measurement arrangement are taken into account.

An acquisition of overview images (what are known as "localizers") that are used as orientation and planning images for the planning of the further measurement workflow subsequently ensues in a typical manner.

In a third step, the measurement parameters for the examination are then established by the operator of the apparatus. This can ensue, for example, using the overview images with the aid of a graphical user interface. For example, the slices are determined, or it is established in which regional regions saturation slices are to be placed, etc.

The actual calculation of the sequence workflow then ensues in the subsequent step. The shapes, the amplitudes and frequencies of the RF pulses necessary for the measurement i=1, ... N are calculated, which RF pulses must be radiated in the course of the subsequent examination in order to implement the desired acquisitions.

An automatic determination of the effective volume W(i) of the appertaining RF pulse subsequently ensues in a process loop for each individual RF pulse i=1, ..., N, and a subsequent calculation of the optimized amplitude and phase activation parameters A(i,j), P(i,j) subsequently ensues for each individual antenna element in order to achieve overall an optimal "overall RF pulse" with optimally homogenous $B_1$ field distribution in the determined effective volume W(i) by the superimposition of the RF pulses radiated by the individual antenna elements.

The loop initially begins with an inquiry chain in order to establish whether, for example, it concerns a slice-selective pulse, a regional saturation pulse or a non-spatially-selective pulse. The steps represented here as individual inquiries alternatively can be formed of a number of individual query steps of various measurement parameters or control parameters, using which it can be established which type of pulse is concerned in which region of the examination volume the pulse should act. It is thus clear that a "normal" excitation pulse or refocusing pulse, for example, in a typical measurement pulse sequence is a slice-selective pulse. In this case, the established slice is recognized and established as a working volume W(i) using the set gradients and the selected frequency of the pulse. Likewise, given radiation of a regional saturation pulse, the effective volume W(i) can be set corresponding to the region in which the saturation pulse should act.

If applicable, after further queries it is established that the pulse is not spatially selective at all. Thus, for example, it can be a general fat saturation pulse. In such cases, the entire imaging volume or, respectively, the entire examination volume is determined as an effective volume W(i) for the appertaining pulse.

In a similar form, it can also be automatically tested whether it concerns a different regionally acting or non-regionally acting preparation pulse, however, for clarity this is not shown in FIG. 2b.

After the determination of the effective volume W(i) for each individual RF pulse to be radiated, in the next step the optimal amplitude activation parameters A(i,j) and phase activation parameters P(i,j) for activation of each individual transmission element j=1, ..., M are then determined for the appertaining pulse 1.

Figure 3:
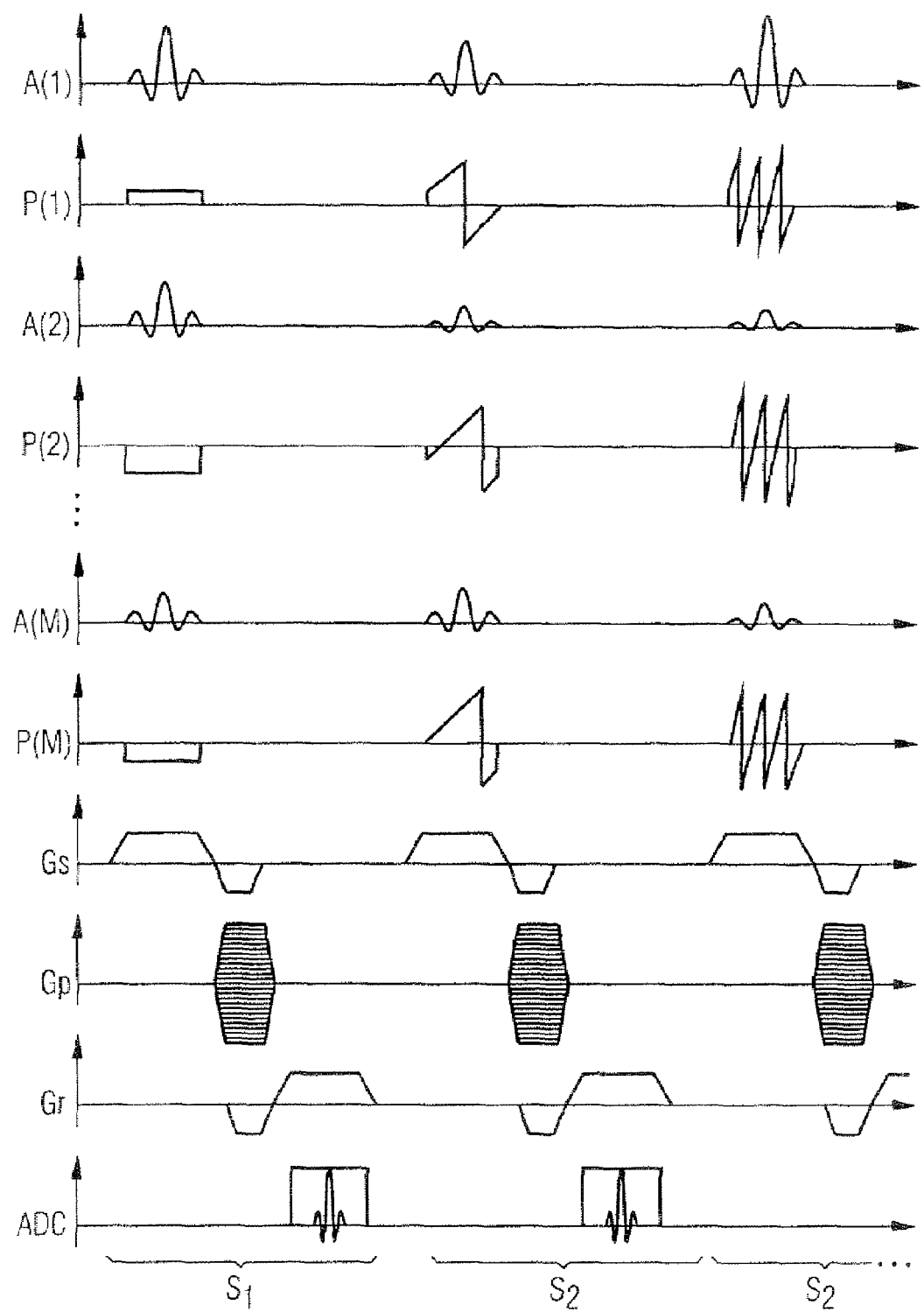
FIG. 3 schematically illustrates an exemplary sequence for a simple gradient echo experiment with three shown slices.

FIG. 3 shows an exemplary sequence workflow for an emission of three successive RF pulses for three different slices $S_1$, $S_2$, $S_3$. The RF pulses emitted in a typical manner on parallel time axes by the radio-frequency antenna—here by the individual antenna elements 1, ..., M—and the matching switched, different gradients temporally dependent on the RF pulses are shown in this pulse frequency schema.

The RF pulses emitted by the radio-frequency antenna elements j=1, 2, ..., M are thereby respectively described by an amplitude modulation A(1), A(2), ..., A(M) and a phase modulation P(1), P(2), ..., P(M) shown directly on the axis beneath it, whereby the parameters specified in the parentheses specify the individual antenna elements j=1, 2, ..., M.

Under the axes for representation of the RF pulses emitted by the individual antenna elements j=1, 2, ..., M, the slice selection gradient $G_s$ is shown, which is applied in the z-direction and is used for the selection of a specific slice given excitation of the spins. Located below this is the phase coding gradient Gp, which provides for a phase coding. This phase coding gradient Gp is very rapidly switched to various values during a measurement. The third gradient Gr is the readout or frequency encoding gradient, which is applied in order to read out signals frequency-coded in a specific slice. The actual signal measured by the ADC (analog-digital converter) is shown on the lowermost time axis.

Overall, a spatially-resolved measurement of signals within the slice determined by the slice-selection gradient together with the frequency of the excitation pulse ensues by suitable switching of the phase coding gradient Gp and the readout gradient Gr. The precise workflow of the phase coding and frequency coding for spatially-resolved measurement within a slice, as well as the representation in such a sequence schema, are known to those skilled in the art and therefore need not be explained further.

The shown example concerns a simple gradient echo experiment with three shown slices $S_1$, $S_2$, $S_3$. The selection of the slices $S_1$, $S_2$, $S_3$ ensues as explained above, by the application of the selection gradients Gs and radiation of a radio-frequency pulse with respectively varying frequency. The different frequency of the RF pulses is shown here within the phase activation axes P(1), P(2), ..., P(M) by a temporally linear phase response (which is, however, limited to $+/-\Pi$). This means that, in a typical manner, the carrier frequency remains the same and the displacement of the radiated frequency of the excitation pulse ensues via the superimposition of the linear phase response. The frequency of the radio-frequency pulse can thus be shifted relative to the carrier frequency, dependent on the slope of the phase response.

As can be seen in FIG. 3, the individual antenna elements j=1, 2, ..., M are respectively activated with different amplitudes A(1), A(2), ..., A(M) and phases P(1), P(2), ..., P(M) for emission of the RF pulses for each of the three slices $S_1$, $S_2$, $S_3$, in order to achieve overall an "overall RF pulse" with optimally good homogenization in the selected slice via the superimposition of all RF pulses emitted by the individual antenna elements j=1, 2, ..., M.

After the individual control parameters, i.e. the amplitude activation parameters and phase activation parameters for each transmission element j=1, ..., M have been calculated for the appertaining pulse i, it is subsequently checked whether still further RF pulses must be optimized. For this, it is checked whether the control variable i has already achieved the value N of the number of the RF pulses to be emitted. If this is not the case, the control variable i is increased by 1 and the loop begins again from the start, i.e. for the next pulse (i+1) the effective volume W(i+1) is determined and the optimal amplitude and phase activation parameters are calculated for each antenna element.

After these calculations for all pulses i=1, ..., N have been implemented, in a later method step the measurement workflow is controlled in a typical manner, whereby the previously calculated amplitude and phase activation parameters A(i,j), P(i,j) are set for each individual antenna element j immediately prior to each RF pulse.

In FIGS. 2a and 2b—for clarity—the case is not shown in which the user establishes the optimization volume, or in which the user establishes a region of interest ROI and the optimization volumes result as intersections from the region of interest ROI determined by the user and the automatically calculated effective volumes W(i) of the radio-frequency pulses. It is clear that it is possible without anything further to integrate these options in the planning, calculation and measurement process.

FIG. 4 shows an exemplary embodiment of a magnetic resonance system 1 with which an automatic measurement according to the method shown in FIGS. 2a and 2b is possible. The core of this magnetic resonance system 1 is a scanner 2 in which a patient on a bed 5 is positioned in an annular basic field magnet. A radio-frequency antenna 3 for emission of the RF pulses is located within the basic field magnet.

This radio-frequency antenna 3 has a number of antenna elements 4 that can be individually activated via separate transmission channels. The design can, for example, correspond to the design cited in German OS 101 24 465. Apart from the special design of the antenna 3 and the necessary components for separate activation of the individual antenna elements 4, it can be a standard tomography apparatus.

The scanner 2 is operated by a control device 6, which is shown separately here. A terminal 14 is connected to the control device 6; this terminal 14 including, in a typical manner, a monitor 15, a keyboard 16 and a pointing device 17 for a graphical user interface, for example a mouse 17. The terminal 14 services as, among other things, a user interface via which an operator operates the control device 6 and therewith the scanner 2.

The control device 6 is here connected with the scanner 2 via the interfaces 9, 10. Both the control device 6 and the terminal 14 can, however, likewise also be integral components of the scanner 2.

The overall magnetic resonance system moreover also exhibits all further typical components or, respectively, features such as, for example, interfaces for connection to a communication network, for example an image information system. These components are not shown in FIG. 3 for clarity.

Via the terminal 14, the operator can communicate with the activation unit 12, which activates the scanner 2 via the interface 9 and, for example, provides for an emission of the desired radio-frequency pulse sequences by the antennas 3 and switches the gradients in a suitable manner in order to implement the desired measurements. Via the interface 10, the measurement data coming from the scanner 2 is acquired and from this the images are reconstructed in a signal evaluation unit 13, which images then can be shown, for example, on the monitor 15 of the terminal 14 and/or be stored in a storage 8 of the control device 6.

The activation unit 12 and the signal evaluation unit 13 can preferably be software modules which are realized on a programmable processor 7 of the control device 6. The storage 8 can also be an external mass storage to which the control device 6 has access, for example over a network.

In the shown magnetic resonance system 1, the control device 6 moreover has a measuring unit 11 (likewise in the form of a software module) that serves for measurement of a $B_1$ field distribution of the RF pulses radiated in the examination volume U by the radio-frequency antenna 3 or by the individual antenna elements 4. For this, the measuring unit 11 prompts, for example, the activation unit 12 to transfer corresponding control commands to the tomograph 2, such that this emits the previously-described double-echo radio-frequency pulse sequences or similar sequences for measurement of the $B_1$ field distribution. The raw data thereby measured are transferred from the signal evaluation unit 13 to the measuring unit 11. There, based on these data, the spatially-resolved $B_1$ field distribution is determined for each individual antenna element 4.

The information about the $B_1$ field distribution is then transferred to an optimization unit—here again realized in the form of a software module—which determines, using the measurement parameters (predetermined by the user via the terminal 14 or automatically by the magnetic resonance system within a measurement protocol) for the RF pulses to be emitted in the following examination, the associated effective volumes or, respectively, optimization volumes and implements the optimization shown in FIG. 2b within the loop. This means that, in this optimization unit 18, the optimized amplitude activation parameter A(i,j) and the phase activation parameter P(i,j) are determined for the individual antenna elements 4 for each individual RF pulse. This information can then be initially buffered in the storage 8, for example in the form of an optimized measurement protocol. If the measurement is subsequently started, this measurement protocol with the optimized activation parameters is transferred from the storage 8 to the activation unit 12, and from there the scanner 2 is correspondingly activated in order to implement the optimized measurement.

In conclusion, it is again noted that the method workflow specified in detail in the preceding as well as the shown magnetic resonance system are only exemplary embodiments which can be modified in the most varied manners by the average man skilled in the art without leaving the scope of the invention. In particular, instead of the described pulse sequence, other pulse sequences can be used. It is likewise also possible to design the antenna in another form other than that specified in German OS 101 24 465. It is significant that only one possibility is given to spatially adjust the $B_1$ field distribution of the emitted radio-frequency pulses with optimal precision.

Although the invention was previously described in an example of magnetic resonance apparatuses, the usage possibilities of the invention are not limited to this area; rather, the invention can likewise also be used in scientific and/or industrially-used magnetic resonance apparatuses.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance system, comprising the steps of:
   prior to acquiring diagnostic magnetic resonance data from an examination volume of a subject with a data acquisition pulse sequence including a plurality of RF pulses emitted from an RF antenna, individually radiating said plurality of RF pulses into the examination volume and determining an effective volume within said examination volume for each of said RF pulses, and, for each of said RF pulses, measuring a B1 field distribution produced in the effective volume for that RF pulse; and
   acquiring said diagnostic magnetic resonance data by applying said data acquisition pulse sequence to said subject and, in said data acquisition pulse sequence, optimizing each of said RF pulses by electronic shimming to homogenize the B1 field distribution produced thereby in the effective volume of each shimmed RF pulse; and
   reconstructing an image of the subject from the acquired magnetic resonance diagnostic data.

2. A method as claimed in claim 1 wherein measuring said $B_1$ field distribution has measurement parameters associated therewith, and wherein applying said pulse sequence to said subject has control parameters associated therewith for emitting the respective RF pulses in said pulse sequence, and wherein the step of determining said effective volume comprises automatically determining said effective volume for each of said RF pulses dependent on at least one of said measurement parameters and the respective control parameters for that RF pulse.

3. A method as claimed in claim 1 wherein at least one of said RF pulses is a slice-selective RF pulse, and comprising, for said slice-selective RF pulse, determining said effective volume to substantially correspond to the selected slice produced by said slice-selective RF pulse.

4. A method as claimed in claim 1 wherein said pulse sequence is designed to obtain said magnetic resonance data from a plurality of slices in said examination volume, and includes a preparation RF pulse, and comprising determining the effective volume for said preparation RF pulse based on a set union of said plurality of slices.

5. A method as claimed in claim 1 wherein said pulse sequence includes a regional preparation RF pulse effective in a region of the examination subject, and comprising determining said effective volume as being substantially equal to said region.

6. A method as claimed in claim 1 comprising, for each of said RF pulses, determining one optimization volume within the effective volume for that RF pulse, dependent on a predetermined region of interest, and optimizing each of said RF pulses to homogenize said $B_1$ field within said optimization volume thereof.

7. A method as claimed in claim 1 wherein said radio frequency antenna comprises a plurality of antenna elements, and comprising emitting each of said RF pulses from said antenna elements by activating the respective antenna elements with a respective phase and a respective amplitude, and comprising optimizing said RF pulses by selectively adjusting the respective phase and the respective amplitude used to emit the respective RF pulse, to optimize said $B_1$ field in said effective volume.

8. A method as claimed in claim 7 wherein the step of determining said $B_1$ field distribution comprises separately determining a $B_1$ field distribution for each of said antenna elements.

9. A method as claimed in claim 1 comprising, upon optimization of each of said RF pulses, storing optimized control parameters associated with the emission of said RF pulses that produce the optimization of the respective RF pulses, and operating said RF antenna with the stored control parameters, when applying said pulse sequence to said subject, to emit said optimized RF pulses.

10. A magnetic resonance system comprising:
a magnetic resonance scanner configured to interact with an examination subject, said magnetic resonance scanner being operable to acquire diagnostic magnetic resonance data from the subject with a data acquisition pulse sequence that includes a plurality of RF pulses, said magnetic resonance scanner including an RF antenna that emits said RF pulses in an examination volume of the subject, and a field distribution measuring unit;
a control unit connected to said magnetic resonance scanner that operates said RF antenna, prior to acquiring said diagnostic magnetic resonance data, to individually radiate said plurality of RF pulses into said examination volume and that operates said measuring unit in order to measure a respective B1 field distribution produced in the examination volume by each of said RF pulses, said control unit determining an effective volume within said examination volume for each of said RF pulses, and that operates said magnetic resonance scanner with said data acquisition pulse sequence in order to acquire said diagnostic magnetic resonance data from said examination volume of the subject, said control unit, in said data acquisition pulse sequence, optimizing each of said RF pulses by electronic shimming in order to homogenize the B1 field distribution produced thereby in the effective volume of each shimmed RF pulse; and
a computer supplied with the acquired diagnostic magnetic resonance data that reconstructs an image of the subject from said diagnostic magnetic resonance data.

11. A magnetic resonance system as claimed in claim 10 comprising a user interface allowing a user to enter a designation of a region of interest within said examination volume, and wherein said control device, for each of said RF pulses, determines an optimization volume for that RF pulse within said effective volume thereof, dependent on said region of interest, and optimizes said RF pulses to homogenize said $B_1$ field distribution within said optimization volume.

12. A magnetic resonance system as claimed in claim 10 wherein said radio frequency antenna comprises a plurality of antenna elements, and wherein said control unit operates the respective antenna elements with respective phases and respective amplitudes for each of said RF pulses to optimize said RF pulses to homogenize said $B_1$ field distribution in the respective effective volumes thereof.

13. A computer-readable medium encoded with a data structure and being loadable into a programmable control device of a magnetic resonance system, said magnetic resonance system having an RF antenna that emits RF pulses each having a B1 field distribution associated therewith, said computer program causing said control unit to operate said magnetic resonance scanner to:
prior to acquiring diagnostic magnetic resonance data from an examination volume of a subject with a data acquisition pulse sequence including a plurality of said RF pulses, individually radiate said plurality of RF pulses into the examination volume, and determine an effective volume within said examination volume for each of said RF pulses, and, for each of said RF pulses, measure the B1 field distribution produced in the effective volume for that RF pulse; and
apply said data acquisition pulse sequence to said subject in order to acquire said diagnostic magnetic resonance data from said examination volume and, in said data acquisition pulse sequence, optimize each of said RF pulses by electronic shimming in order to homogenize the B1 field distribution produced thereby in the effective volume of each shimmed RF pulse, and to store the acquired diagnostic magnetic resonance data in order to allow an image of the subject to be reconstructed therefrom.

* * * * *